United States Patent [19]
Karlsson et al.

[11] Patent Number: 5,963,841
[45] Date of Patent: Oct. 5, 1999

[54] GATE PATTERN FORMATION USING A BOTTOM ANTI-REFLECTIVE COATING

[75] Inventors: Olov B. Karlsson, San Jose; Christopher F. Lyons, Fremont; Minh Van Ngo, Union City; Scott A. Bell; David K. Foote, both of San Jose, all of Calif.

[73] Assignee: Advanced Micro Devices, Inc., Sunnyvale, Calif.

[21] Appl. No.: 08/924,370

[22] Filed: Sep. 5, 1997

Related U.S. Application Data

[63] Continuation-in-part of application No. 08/905,104, Aug. 1, 1997.

[51] Int. Cl.[6] .................................................. H01L 21/302
[52] U.S. Cl. .................... 438/952; 438/585; 438/717; 438/736; 134/1.3; 430/5
[58] Field of Search .................... 438/585, 952, 438/717, 736; 134/1.2, 1.3; 430/5

[56] References Cited

U.S. PATENT DOCUMENTS

| | | | |
|---|---|---|---|
| 4,688,069 | 8/1987 | Joy et al. | 357/34 |
| 4,869,781 | 9/1989 | Even et al. | 156/643 |
| 5,431,770 | 7/1995 | Lee et al. . | |
| 5,482,894 | 1/1996 | Havemann | 437/195 |
| 5,545,578 | 8/1996 | Park et al. . | |
| 5,567,631 | 10/1996 | Hsu et al. . | |
| 5,580,700 | 12/1996 | Rahman . | |
| 5,600,165 | 2/1997 | Tsukamoto et al. . | |
| 5,605,601 | 2/1997 | Kawasaki | 156/643.1 |
| 5,620,912 | 4/1997 | Hwang et al. . | |
| 5,756,401 | 5/1998 | Iizuka | 156/643 |
| 5,804,088 | 9/1998 | McKee | 216/47 |

FOREIGN PATENT DOCUMENTS

| | | |
|---|---|---|
| 61-099331 | 5/1986 | Japan . |
| 8-017922 | 1/1996 | Japan . |

OTHER PUBLICATIONS

"Optically Matched Trilevel Resist Process For Nanostructure Fabrication"; Schattenburg et al.; J. Voc. Sci. Tech., B (1995), 13(6), pp. 3007–3011, 1995.

"Submicron Optical Lithography Utilizing A Negative Deep UV Resist MRS"; Tomioka; Proc. SPIE—Int. Soc. Opt. Eng (1985), 539 (Adv. Resist Tech. Proc. 2); pp. 151–159.

*Primary Examiner*—Benjamin Utech
*Assistant Examiner*—George Goudreau

[57] ABSTRACT

A gate is formed on a semiconductor substrate by using a bottom anti-reflective coating (BARC) to better control the critical dimension (CD) of the gate as defined via a deep-UV resist mask formed thereon. The wafer stack includes a gate oxide layer over a semiconductor substrate, a polysilicon gate layer over the gate oxide layer, a SiON BARC over the conductive layer, a thin oxide film over the SiON BARC. The resist mask is formed on the oxide film. The SiON BARC improves the resist mask formation process. The wafer stack is then shaped to form one or more polysilicon gates by sequentially etching through selected portions of the oxide film, the BARC, and the gate conductive layer as defined by the etch windows in the resist mask. Once properly shaped, the remaining portions of the resist mask, oxide film and SiON BARC are removed.

18 Claims, 1 Drawing Sheet

GATE PATTERN FORMATION USING A BOTTOM ANTI-REFLECTIVE COATING

RELATED APPLICATIONS

This application is a continuation-in-part of application Ser. No. 08/905,104 filed Aug. 1, 1997, titled Controlled Linewidth Reduction During Gate Pattern Formation Using an SiON BARC, which is hereby incorporated by reference in its entirety and for all purposes.

TECHNICAL FIELD

The present invention relates to semiconductor devices and manufacturing processes, and more particularly to methods for forming conductive gates within a semiconductor device using a bottom anti-reflective coating (BARC).

BACKGROUND ART

A continuing trend in semiconductor technology is to build integrated circuits with more and/or faster semiconductor devices. The drive toward this ultra large-scale integration (ULSI) has resulted in continued shrinking of device and circuit dimensions and features. In integrated circuits having field-effect transistors, for example, one very important process step is the formation of the gate for each of the transistors, and in particular the dimensions of the gate. In many applications, the performance characteristics (e.g., switching speed) and size of the transistor are functions of the size (e.g., width) of the transistor's gate. Thus, for example, a narrower gate tends to produce a higher performance transistor (e.g., faster) that is inherently smaller in size (e.g., narrower width).

As is often the case, however, there are limitations to existing techniques that reduce their effectiveness or even exclude their use in fabricating the next generation of integrated circuit devices. For example, the limitations of conventional lithographic techniques and tools, which are used to pattern the gates during fabrication, are quickly being realized. According, there is a continuing need for more efficient and effective fabrication processes for forming transistor gates that are smaller and/or exhibit higher performance.

SUMMARY OF THE INVENTION

The present invention provides a method for forming a gate on a semiconductor substrate by using a bottom anti-reflective coating (BARC) to better control the critical dimension (CD) of the gate as defined a resist mask.

In one embodiment of the present invention, the method includes creating a wafer stack, shaping the wafer stack and removing remaining portions the resist mask and BARC.

Thus, in certain embodiments, the wafer stack is created by forming a dielectric layer over the semiconductor substrate and depositing a conductive layer over the dielectric layer. Once this has been completed, a BARC is deposited over the conductive layer and an oxide film is formed on the BARC. Next, the resist mask is formed on the oxide film during which the BARC reduces, suppresses and/or otherwise attenuates interference and standing waves created during the resist mask formation. In certain embodiments, the resist mask is further trimmed to size at this stage.

Shaping this wafer stack includes sequentially etching through selected portions of the oxide film, the BARC, and the gate conductive layer as defined by the etch windows in the resist mask. Next, the resist mask is stripped or otherwise removed so as to expose the remaining portion of the oxide film, which is then also removed so as to reveal a remaining portion of the BARC. This remaining portion of the BARC is then removed as well.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drown to scale, but instead are drawn so as to illustrate the important features of the present invention.

In accordance with an embodiment of the present invention, there is provided a process for forming at least one gate conductor within an integrated circuit using a silicone oxynitride (e.g., $SiO_xN_y$, referred to hereinafter as SiON) film as a bottom anti-reflective coating (BARC). The process, in accordance with the present invention, eliminates the need to use an organic spin-on BARC, allows for better critical dimension (CD) uniformity across varying circuit densities, and increases the depth of focus during subsequent patterning steps. As such, the present invention provides better process control over the gate formation and eliminates the potential for defects traceable to the use of an organic spin-on BARC.

Figure 1:
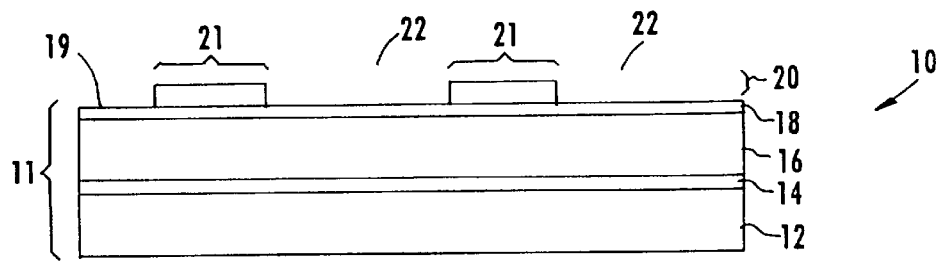
FIG. 1 depicts a cross-section of a portion of a semiconductor wafer which has been prepared for gate conductor formation, in accordance one embodiment of the present invention.

FIG. 1 depicts a cross-section of a portion 10 of a semiconductor device being fabricated on a semiconductor wafer, in accordance with the present invention. Portion 10 includes a wafer stack 11 having a substrate 12, a gate dielectric 14, a gate conductive layer 16, and a BARC 18. As depicted, there is also a resist mask 20 that has been patterned on top of BARC 18. In accordance with one embodiment of the present invention, substrate 12 includes a heavily-doped silicon layer, approximately 2 mm thick, and a lightly-doped epitaxial (epi) layer, approximately 4 μm thick, which is grown on the heavily-doped silicon layer. Gate dielectric layer 14 acts as a barrier between gate conductive layer 16 and substrate 12. In one embodiment of the present invention, gate dielectric layer 14 is an oxide layer, approximately 55 Å thick, which is formed on top of substrate 12. Gate conductive layer 16, in one embodiment, is a layer of polycrystalline silicon, approximately 1,700 Å thick, which is formed on top of gate dielectric layer 14.

BARC 18, which is preferably SiON or a similar silicon-rich material, is then applied on top of gate conductive layer 16. The benefits of using a BARC are known in the art. For example, BARC 18 can be tuned to suppress a particular wavelength associated with reflected interference waves and/or standing waves produced by one or more underlying layers during subsequent resist patterning process steps. Without a BARC, the reflected interference waves and/or standing waves would significantly hinder or otherwise limit the formation of a resist mask having a controlled pattern and/or smaller critical dimensions. Thus, as discussed in greater detail below, when combined with the proper lithographic techniques, BARC 18 allows for a higher density layout to be fabricated by providing better patterning processes and thereby allowing smaller gates to be formed. Furthermore, BARC 18 acts as a barrier layer between gate conductive layer 16 and resist mask 20.

BARC 18, in accordance with the present invention is preferably an inorganic layer that is deposited over gate conductive layer 16, such as, for example, SiON, silicon oxime (e.g., $Si_{(1-x+y+z)}N_xO_y{:}H_z$), or silicon nitride (e.g., $Si_3N_4$). BARC 18, in an exemplary embodiment, is a thin layer of SiON tuned, through process conditions, to absorb reflected deep-UV wavelengths (e.g., approximately 248 nm) during the creation of resist mask 20 using conventional deep-UV lithography techniques. By absorbing deep-UV wavelengths, BARC 18 substantially eliminates potentially damaging reflected interference and/or standing waves. The deposition of BARC 18, such as for example, through conventional CVD techniques, creates a more uniform layer than a typical spin-on organic BARC material. This tends to provide better process control than the traditional spin-on techniques that are often harder to control and more likely to introduce defects, such as, for example, through contaminants. In a preferred embodiment, BARC 18 is an SiON layer that has been deposited using PECVD and further exposed to a $N_2O$ treatment, in-situ, to form a very-thin oxide skin 19 on the upper surface which acts as a passivation layer to prevent contamination from resist mask 20.

Next, resist mask 20, such as, for example, a deep-UV resist mask, is applied to BARC 18 (e.g., on top of skin 19) to define one or more etch windows 22 for use in forming one or more gates from gate conductive layer 16. As shown, resist mask 20 defines line widths 21 that correspond to the desired width of the gates to be formed within stack 11. The patterning of resist mask 20, and in particular the sizing of line widths 21, in accordance with one embodiment of the present invention, is further defined by trimming a preliminary resist mask (not shown) using an isotropic etching process so as to further reduce the CD of the gates to be formed. Thus, line widths 21, as depicted in FIG. 1, have already been trimmed to size.

Figure 2:
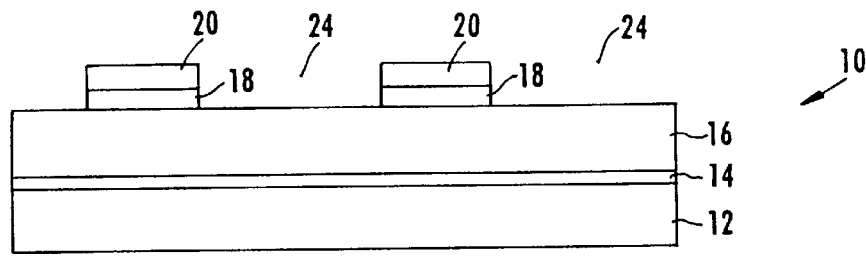
FIG. 2 depicts a cross-section of the portion of FIG. 1 following a selective BARC etching process, in accordance one embodiment of the present invention.

FIG. 2 depicts portion 10 of FIG. 1 following a BARC etching process in which the pattern of resist mask 20 is essentially transferred to BARC 18 by anisotropically etching away exposed portions of oxide skin 19 and BARC 18, for example, through etch windows 22.

Figure 3:
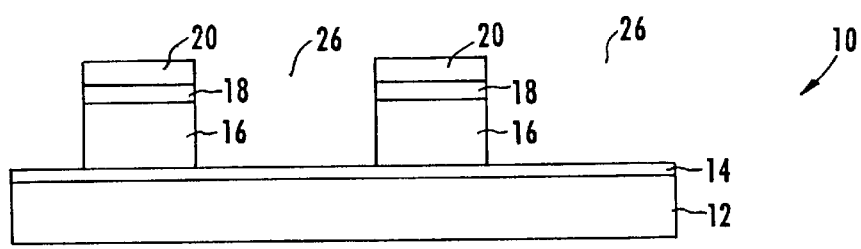
FIG. 3 depicts a cross-section of the portion of FIG. 2 following a gate conductive layer etching process, in accordance one embodiment of the present invention.

FIG. 3 depicts portion 10 of FIG. 2 following a gate conductive layer etching process in which etched openings 26 are created through extended etch windows 24 and extend through gate conductive layer 16 to gate dielectric layer 14. As depicted, the gate conductive layer etching process, which is preferably an anisotropic etching process, removed selected portions of gate conductive layer 16 located substantially below etch windows 24. By way of example, if gate conductive layer 16 is a layer of polysilicon then the gate conductive layer etching process will preferably have a high-selectivity to the material of gate dielectric layer 14, such as, for example, oxide.

Figure 4:
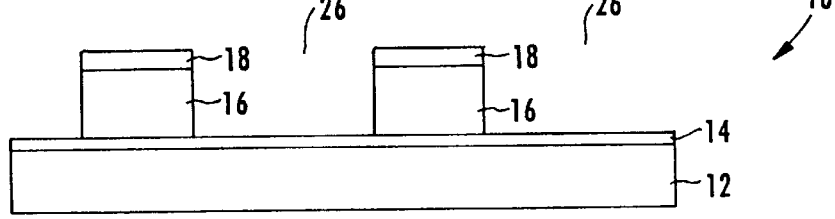
FIG. 4 depicts a cross-section of the portion of FIG. 3 following a resist mask removal process, in accordance one embodiment of the present invention.
Figure 5:
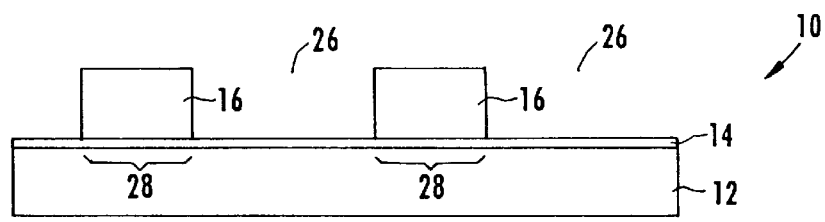
FIG. 5 depicts a cross-section of the portion of FIG. 4 following a second BARC etching process, in accordance one embodiment of the present invention.

In FIG. 4, portion 10 of FIG. 3 has had the remaining portions of resist mask 20 stripped, for example, using conventional wet resist strip techniques. Similarly, in FIG. 5, portion 10 of FIG. 4 has had the remaining portions of oxide skin 19 and BARC 18 removed. For example, in one embodiment of the present invention, oxide skin 19 and BARC 16 are removed using conventional wet etching techniques and HF and $H_3PO_4$ solutions. As a result, the remaining portions of gate conductive layer 16 form gates that can then be used to form completed transistors in subsequent processes.

Thus, the use of this novel process that uses an SiON BARC to form gates, in accordance with the present invention, allows for reduced gate and/or line CDs, improved performance, increased circuit density, and fewer defects.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for forming a gate structure from a semiconductor wafer stack comprising a substrate, a dielectric layer over the substrate, a conductive layer over the dielectric layer, a deposited bottom anti-reflective coating over the conductive layer, an oxide film over the bottom anti-reflective coating, and a resist mask on the oxide film, the method comprising:

etching through selected portions of the oxide film as defined by etch windows in the resist mask;

etching through selected portions of the bottom anti-reflective coating as defined by the etch windows;

etching through selected portions of the gate conductive layer as defined by the etch windows;

removing the resist mask so as to expose a remaining portion of the oxide film;

removing the remaining portion of the oxide film so as to reveal a remaining portion of the bottom anti-reflective coating; and removing the remaining portion of the bottom anti-reflective coating.

2. The method as recited in claim 1, wherein the bottom anti-reflective coating comprises $SiO_xN_y$.

3. The method as recited in claim 2, wherein the oxide film is formed by reacting the bottom anti-reflective coating with $N_2O$.

4. The method as recited in claim 2, wherein the method further comprises trimming portions of the resist mask prior to etching through the oxide film.

5. The method as recited in claim 2, wherein the substrate includes:

a heavily-doped silicon layer, approximately 2 mm thick; and a lightly-doped epitaxial (epi) layer, approximately 4 μm thick.

6. The method as recited in claim 2, wherein the gate dielectric layer includes an oxide layer, approximately 55 Å thick.

7. The method as recited in claim 6, wherein the gate conductive layer includes a polycrystalline silicon layer, approximately 1,700 Å thick.

8. The method as recited in claim 2, further comprising configuring the bottom anti-reflective coating to attenuate interference waves produced in forming the resist mask.

9. The method as recited in claim 8 wherein the resist mask is formed using deep-UV wave forms and the bottom anti-reflective coating attenuate interference waves having an approximate wavelength of 248 nm.

10. A method for forming a gate on a semiconductor substrate using a bottom anti-reflective coating, the method comprising:

creating a wafer stack by forming a dielectric layer over the substrate, depositing a conductive layer over the dielectric layer, depositing a bottom anti-reflective coating over the conductive layer, forming an oxide film on the bottom anti-reflective coating, and forming a resist mask on the oxide film; and shaping the wafer stack by sequentially etching through selected portions of the oxide film, the bottom anti-reflective coating, and the gate conductive layer as defined by the etch windows; and removing the resist mask so as to expose a remaining portion of the oxide film, etching away the remaining portion of the oxide film so as to reveal a remaining portion of the bottom anti-reflective coating, and etching away the remaining portion of the bottom anti-reflective coating.

11. The method as recited in claim 10, wherein the bottom anti-reflective coating comprises $SiO_xN_y$.

12. The method as recited in claim 11, wherein the oxide film is formed by reacting the bottom anti-reflective coating with $N_2O$.

13. The method as recited in claim 11, wherein the method further comprises trimming portions of the resist mask prior to etching through the oxide film.

14. The method as recited in claim 11, wherein the substrate includes:

a heavily-doped silicon layer, approximately 2 mm thick; and a lightly-doped epitaxial (epi) layer, approximately 4 μm thick.

15. The method as recited in claim 11, wherein the gate dielectric layer includes an oxide layer, approximately 55 Å thick.

16. The method as recited in claim 15, wherein the gate conductive layer includes a polycrystalline silicon layer, approximately 1,700 Å thick.

17. The method as recited in claim 11, wherein the bottom anti-reflective coating is configured to attenuate interference waves produced in forming the resist mask.

18. The method as recited in claim 17 wherein the resist mask is formed using deep-UV wave forms and the bottom anti-reflective coating attenuate interference waves having an approximate wavelength of 248 nm.

* * * * *